US007360187B2

(12) United States Patent
Jones et al.

(10) Patent No.: US 7,360,187 B2
(45) Date of Patent: Apr. 15, 2008

(54) MIXED MODE VERIFIER

(75) Inventors: Kevin D. Jones, Hayward, CA (US); Thomas J. Sheffler, San Francisco, CA (US); Kathryn M. Mossawir, Stanford, CA (US); Qiang Hong, San Jose, CA (US); Paul Wong, San Jose, CA (US); Jing Jiang, Stanford, CA (US)

(73) Assignee: Rambus Inc., Los Altos, CA (US)

( * ) Notice: Subject to any disclaimer, the term of this patent is extended or adjusted under 35 U.S.C. 154(b) by 226 days.

(21) Appl. No.: 11/242,599

(22) Filed: Sep. 30, 2005

(65) Prior Publication Data

US 2007/0079268 A1    Apr. 5, 2007

(51) Int. Cl.
G06F 17/50    (2006.01)
(52) U.S. Cl. ............................................. 716/5; 716/4
(58) Field of Classification Search .................... 716/5, 716/4; 703/13, 14
See application file for complete search history.

(56) References Cited

U.S. PATENT DOCUMENTS 5,535,223 A * 7/1996 Horstmann et al. ......... 714/744
6,237,126 B1 * 5/2001 Bonitz ........................... 716/4

2002/0049576 A1 * 4/2002 Meyer ............................ 703/14

OTHER PUBLICATIONS

Hinners et al.,"SYSCHECK: A User-Programmable Mixed-mode Verification Tool",May 1993, Proceeding of the IEEE 1993 Custom Integrated Circuits Conference, pp. 13.6.1-13.6.4.*
Litovski et al.,"Modeling the D/A interface for Mixed-mode Behavioral Simulation", Sep. 2003, The IEEE Region 8 EUROCON 2003, Computer as a Tool, Technical Paper, vol. 1, pp. 130-133.*
Ghosh, A., "Formal verification of synthesized mixed signal designs using BMDs", Thirteenth International Conference on VLSI Design, 2000. pp. 84-90.

* cited by examiner

*Primary Examiner*—Sun James Lin
(74) *Attorney, Agent, or Firm*—Hickman Palermo Truong & Becker LLP

(57) ABSTRACT

A method and system for formally verifying designs having elements from more than a single design domain is described. An example system allows formal verification of a design containing mixed analog and digital subparts. The system may use different proof engines to solve an appropriate sub-partition of the entire design, and may provide a framework for translating between the different domains to create a unified result. For example, a digital proof engine may be used for a digital only subpart, while an analog proof engine may be used for an analog only subpart. The system may use the partitioning results to determine translators between the various domains, and an order in which the proof engines are applied.

20 Claims, 11 Drawing Sheets

Mixed Mode Verification for Digital and Analog Domains

Mixed Mode Verifier

Mixed Mode
Verification for Digital and Analog Domains

Application of Mixed Mode Proof Engines

Example of Mixed Mode Device Under Test (DUT)

$$434 \quad \forall r \in R, r \implies C_{out} \in C_{min..max}$$

Fig. 4(b)
Example
Property to
Prove for DUT $$444 \quad S_{in} \implies r \in R \text{ AND } R \implies P(D_{out})$$

Fig. 4(c)
Example Digital
Domain Sub-Property
to Prove for DUT $$454 \quad C_{out} \implies C_{in}$$

Fig. 4(d)
Example Analog
Domain Sub-Property
to Prove for DUT $$464 \quad C_{out} = T(D_{in})$$

Fig. 4(e)
Example
Translation Function
(D-to-A)

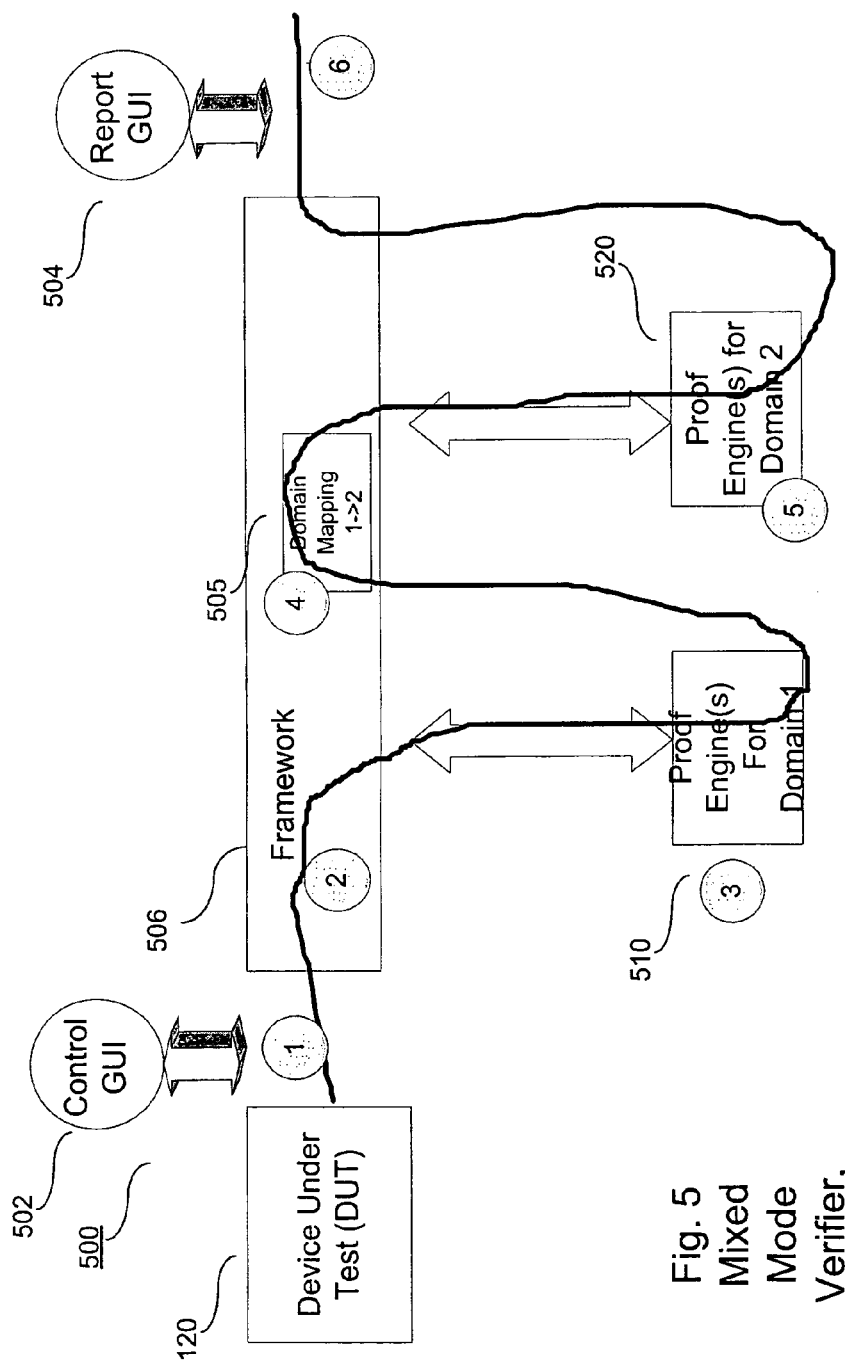
Fig. 5 Mixed Mode Verifier, First Execution Example, After Analysis

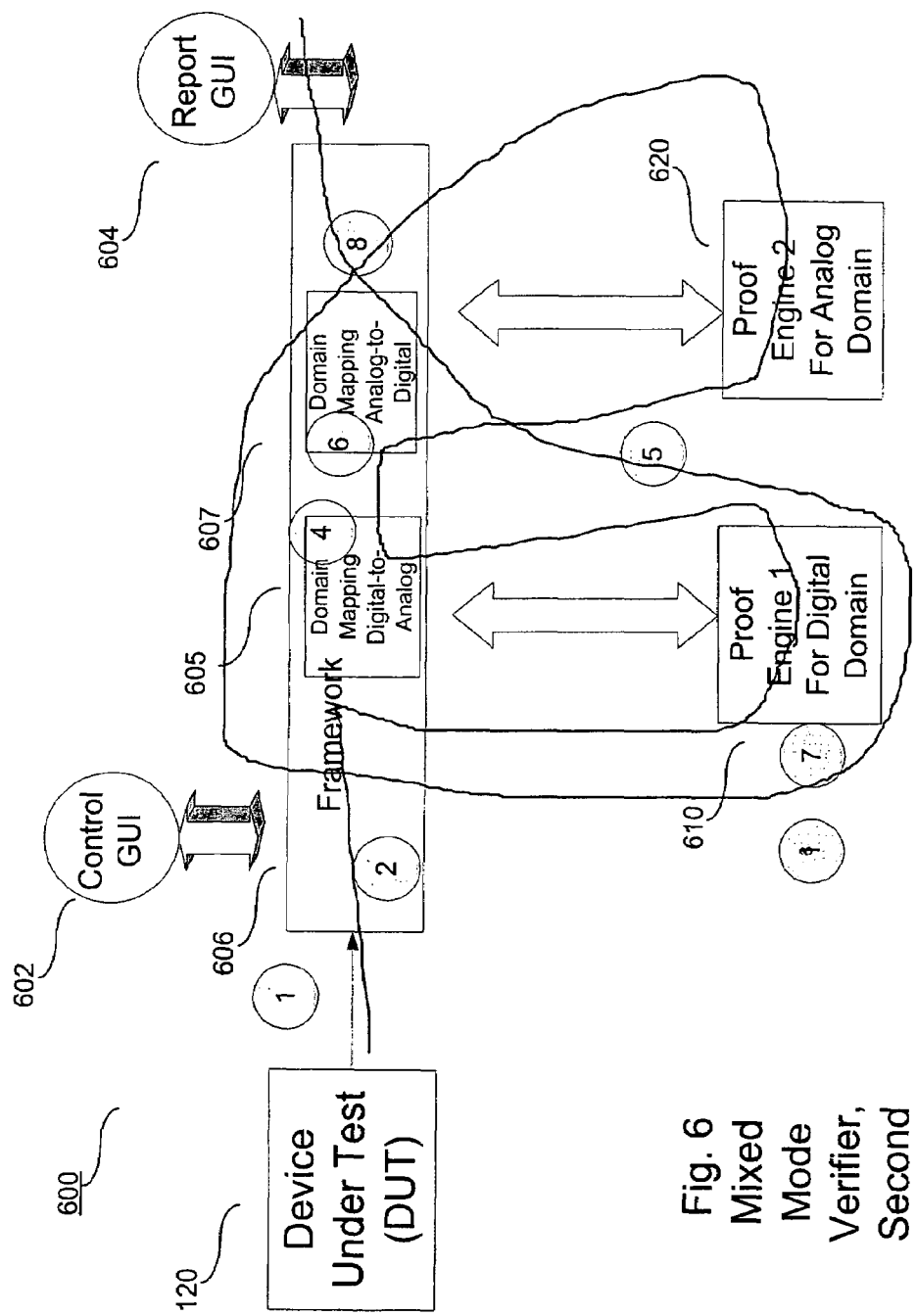
Fig. 6 Mixed Mode Verifier, Second Executable Example, after Analysis

Example User Interface for Mixed Mode Verifier

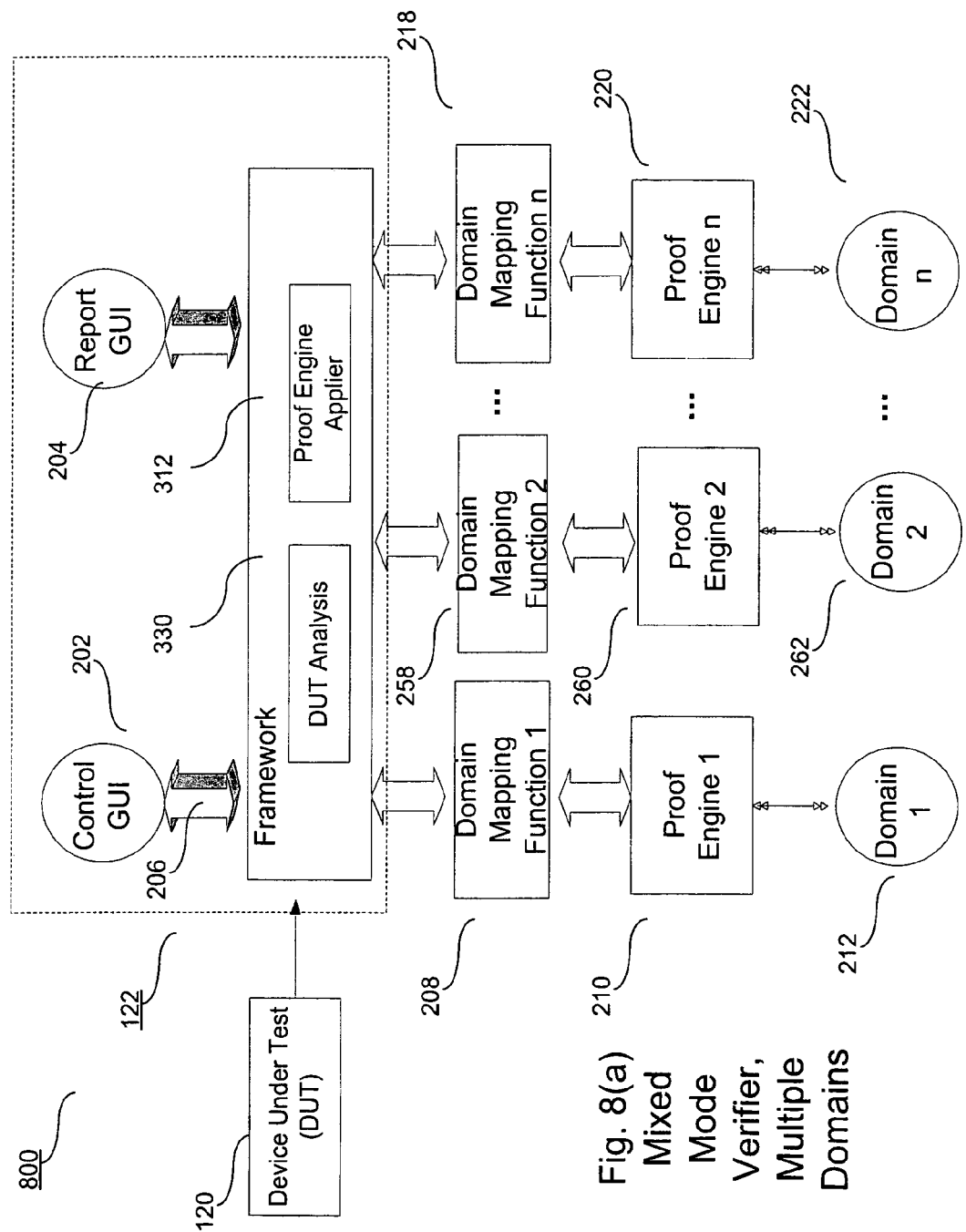
Fig. 8(a) Mixed Mode Verifier, Multiple Domains

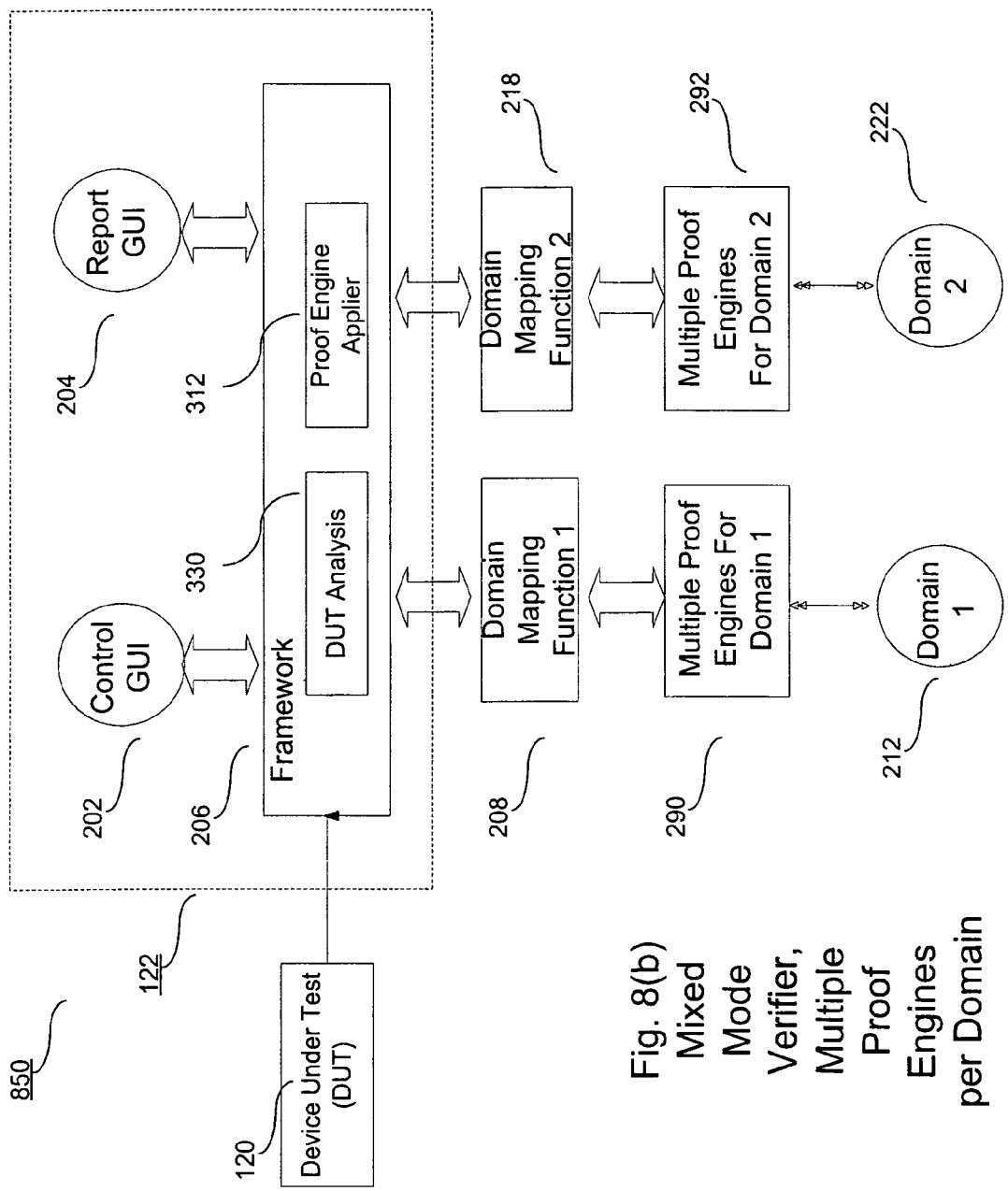
Fig. 8(b) Mixed Mode Verifier, Multiple Proof Engines per Domain

MIXED MODE VERIFIER

BACKGROUND OF THE INVENTION

Conventional verification tools can formally verify the correctness of designs for hardware devices if the design elements belong to a single design domain. While formal conventional hardware verification tools exist for designs that are entirely in the digital design domain, real world designs are not always purely digital. For example, conventional formal verification tools have not been able to formally verify designs having both digital and analog components.

While conventional formal design verification tools can check the design of digital hardware that receives mixed mode inputs, they cannot formally verify designs having internal elements that are both analog and digital. Moreover, while conventional simulation software tools can simulate a mixed domain hardware design, that same mixed domain design currently cannot be verified formally.

It would be desirable to implement a method, system, and tool that is able to formally verify more complex designs having design elements from more than a single design domain.

BRIEF DESCRIPTION OF THE DRAWINGS

The teachings herein can be readily understood by considering the following detailed description in conjunction with the accompanying drawings. Like reference numerals are used for like elements in the accompanying drawings.

FIG. 4(b) shows an example property that is to be verified for the device of FIG. 4(a).

FIG. 4(c) shows an example sub-property in the digital domain for the device of FIG. 4(a).

FIG. 4(d) shows an example sub-property in the analog domain for the device of FIG. 4(a).

FIG. 4(e) shows an example translation function from digital-to-analog for the device of FIG. 4(a).

FIG. 5 shows an example control flow during proofing in a mixed mode verifier.

FIG. 6 shows a control flow during proofing in a mixed mode verifier for the device of FIG. 4(a).

FIG. 8(a) shows an example block diagram of another example of a mixed mode verifier, where the verifier includes proof engines across more than two domains.

FIG. 8(b) shows an example block diagram of a third example of a mixed mode verifier, where the verifier includes multiple proof engines per domain.

The figures depict embodiments for purposes of illustration only. One will recognize from the following discussion that alternative embodiments of the structures and methods illustrated herein may be employed without departing from the principles described herein.

DETAILED DESCRIPTION OF THE EMBODIMENTS

The following paragraphs describe various examples of a mixed mode formal verifier. In an example embodiment, a computer system performs formal verification (also called proof) of a design containing mixed analog and digital design. In this example, a design to be formally verified is analyzed and partitioned into sub-parts. A formal verification tool may use different proof engines to solve an appropriate sub-partition of the entire design, and may provide a framework for translating between the different domains to create a unified result. For example, a digital proof engine may be used for a digital only subpart, while an analog proof engine may be used for an analog only subpart. The formal verification tool may use the partitioning results to determine translators between the various domains and an order in which the proof engines are applied. Once analysis is complete, the tool can initiate several proof engines to provide a formal proof of the respective sub-partitions of the design. Various ones of these proof engines (also called sub-verifiers), can operate to do formal proofs of a design in various modes.

Figure 1:
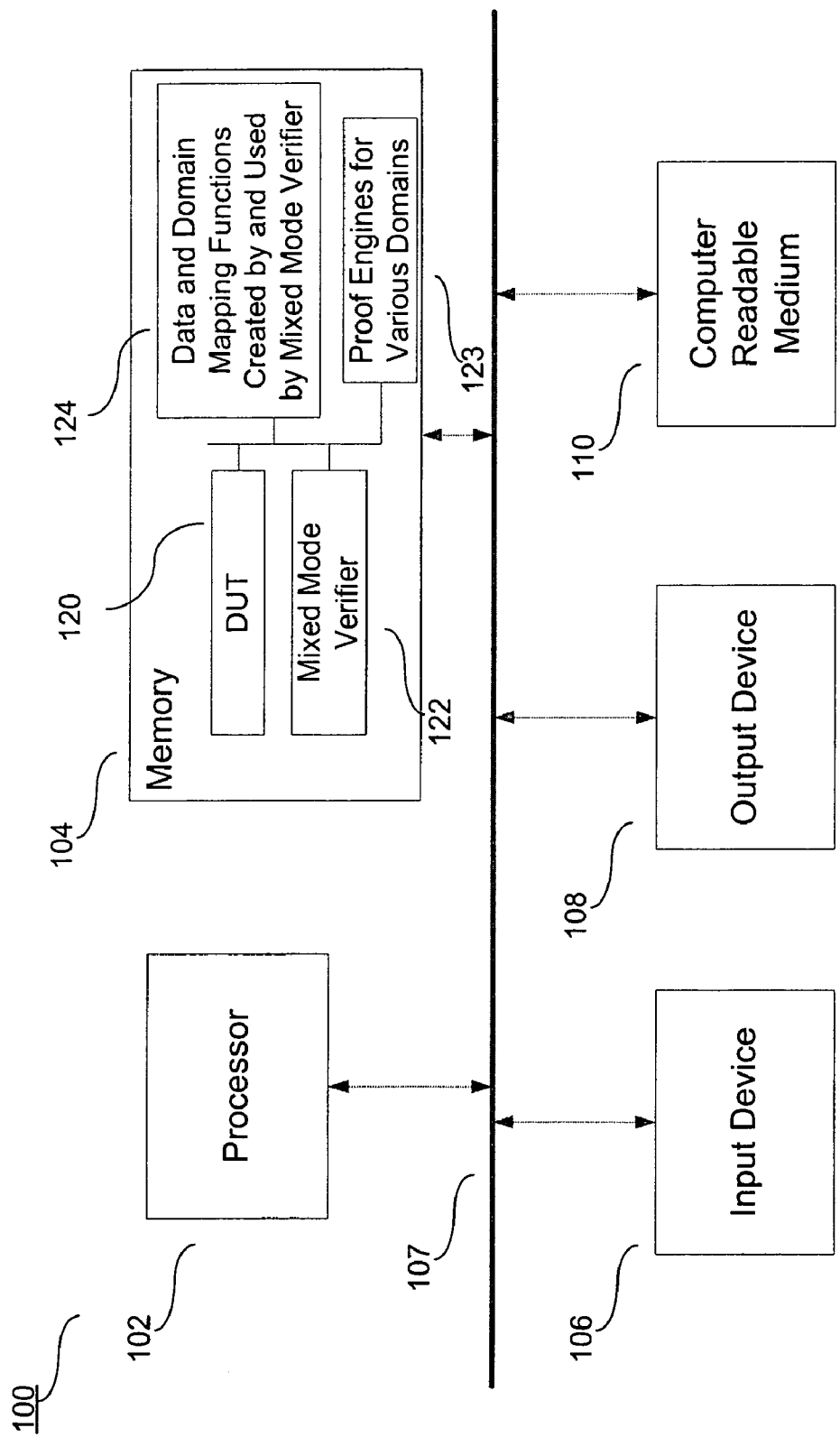
FIG. 1 is a block diagram showing a data processing system in accordance with an embodiment of the invention.

FIG. 1 is a block diagram showing an example data processing system 100 that might be used in some embodiments. FIG. 1 shows a processor 102 coupled to a memory 104 via, for example, bus 107. Processor 102 executes instructions stored in memory 104, such as the instructions of mixed mode formal verifier software 122. Memory 104 may include data such as data and translation functions 124 (also called domain mapping functions) created by and used by mixed mode verifier 122. Memory 104 also may include multiple proof engines 123 for various domains (e.g., digital, analog, etc.) as described below.

FIG. 1 also shows an input device 106, an output device 108, and a computer readable medium 110. Input device 106 provides a way for a user to communicate commands to the system and to identify a device under test (also called design under test or DUT) 120 that is to be formally verified. Input device 106 can be any appropriate device, such as a keyboard, trackball, voice input system, scanner, and so on. Output device 108 provides a way to present results of verifier 122 and to interact with the user. Output device 108 can be any appropriate device, such as a display screen, a printer, and so on. Computer readable medium is used, for example, to store at least verifier 122 and in some embodiments, to store other contents of memory 104 as needed by verifier 122. Computer readable medium 110 can be any appropriate medium used to store at least verifier 122. Computer readable medium can include, without limitation, a memory, a memory chip, a floppy disk, a CD, a DVD, and signals on a wired or wireless network medium.

It is understood herein that system 100 can also include other elements not shown in the figure. System 100 is provided by way of example and is not intended to limit the invention in any way. The term "module" may be used throughout this document. As used herein, "module" indicates software having a particular functionality. The term module does not limit the invention to a particular organization or division of functionality and various implementations of the invention may use various internal organizational systems for software implementing the invention instead of, or in addition to, those shown in the Figure.

Moreover, some examples, including verifier 122, can be implemented in hardware, software, firmware, or any combination-thereof. Examples can be a standalone tool or as a part of a larger system, wherein the formal verification functionality is a part of a larger purpose of a tool. A formal verifier can provide formal verification of a hardware design provided in any appropriate format. Many of the methods described herein, and many of the proof engines can be run in parallel or in series, can be run on a server farm, multiple CPU machines, cluster, etc.

Figure 2:
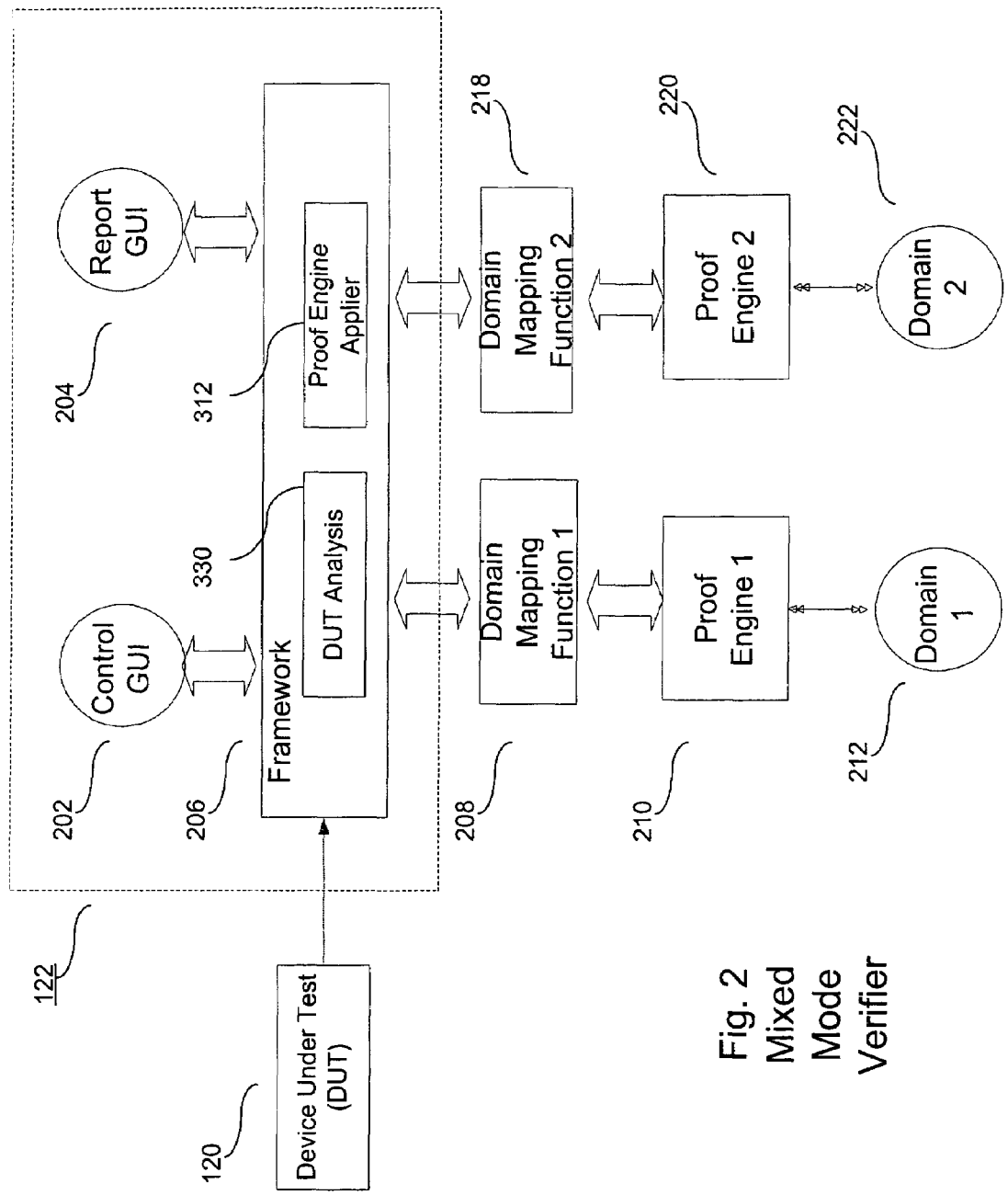
FIG. 2 is a block diagram of a mixed mode verifier of FIG. 1.

FIG. 2 is a block diagram of a mixed mode formal verifier 122 of FIG. 1. The purpose of verifier 122 is to formally verify DUT 120 that contains elements in more than one design domain such as design domain 1 212 and design domain 2 222.

An example DUT 120 is show in FIG. 4. In general, a DUT input to preferred embodiments of the present invention includes elements specified in a digital domain using state tables, or truth tables, or a hardware description language such as Verilog or VHDL. A DUT might also include elements specified in an analog domain using a generic netlist or a netlist-based format such as SPICE or EDIF (Electronic Design Interchange Format).

In FIG. 2, DUT 120 is provided to a framework 206. Framework 206 includes an analysis module 330 to analyze DUT 120 and a verification applier module 312 to control application of proof engines and mapping functions to DUT 120. An input control interface (for example, a GUI or a command line text interface) 202 allows a user to identify DUT 120 and other appropriate parameters. In some embodiments, input control interface 202 also allows the user to specify or limit which proof engines to use for one or more design domains. An output control interface (for example, a GUI or a text interface) 204 allows mixed mode verifier 122 to communicate its results and, optionally, to communicate the steps performed during formal verification (in some embodiments, the user can control the amount of and kinds of data reporting).

FIG. 2 also shows two domain mapping functions: a domain mapping function 208 which maps from domain 1 to domain 2, and a domain mapping function 218 which maps from domain 2 to domain 1. FIG. 2 also shows a proof engine 210 for verifying designs in design domain 212 and a proof engine 220 for verifying designs in design domain 222. These proof engines can be any appropriate engine used for formal verification of a design in a particular domain.

For example, proof engines used in the analog domain include but are not limited to engines described in the following articles, which are incorporated herein by reference:

1. D. Grabowski, D. Platte, L. Hedrich, and E. Barke, "Time Constrained Verification of Analog Circuits using Model-Checking Algorithms," Workshop on Formal Verification of Analog Circuits, Apr. 9, 2005, Edinburgh UK.

2. M. Freibothe, "Formal Verification of the Quasi-Static Behavior of Mixed-Signal Circuits by Property Checking," Workshop on Formal Verification of Analog Circuits, Apr. 9, 2005, Edinburgh UK.

3. C. Myers, R. Harrison, D. Walter, N. Seegmiller, and S Little, "The Case for Analog Circuit Verification," Workshop on Formal Verification of Analog Circuits, Apr. 9, 2005, Edinburgh UK.

4. S. Yang and M. Greenstreet, "Analysing the Robustness of Surfing Circuits," Workshop on Formal Verification of Analog Circuits, Apr. 9, 2005, Edinburgh UK.

5. G. Frehse, B. Krogh, O. Maler, and R. Rutenbar, "Time Domain Verification of Oscillator Circuit Properties," Workshop on Formal Verification of Analog Circuits, Apr. 9, 2005, Edinburgh UK.

For example, proof engines used in the digital domain could be a BDD (Binary Decision Diagram)-based model checker. Such model checkers are described in, for example, the following documents, which are incorporated herein by reference.

1. Dirk Beyer, Claus Lewerentz, and Andreas Noack. Rabbit: A Tool for BDD-based Verification of Real-Time Systems. In W. A. Hunt and F. Somenzi, editors, Proceedings of the 15th International Conference on Computer Aided Verification (CAV 2003), LNCS 2725, pages 122–125, 2003. Springer-Verlag, Berlin.

2. K. L. McMillan, "Symbolic Model Checking—an approach to the state explosion problem," PhD thesis, SCS, Carnegie Mellon University, 1992.

3. A. Cimatti, "NuSMV 1.1 User Manual," IRST—Via Sommarive 18, 38055 Povo (trento) Italy, copyright 1998.

Figure 3A:
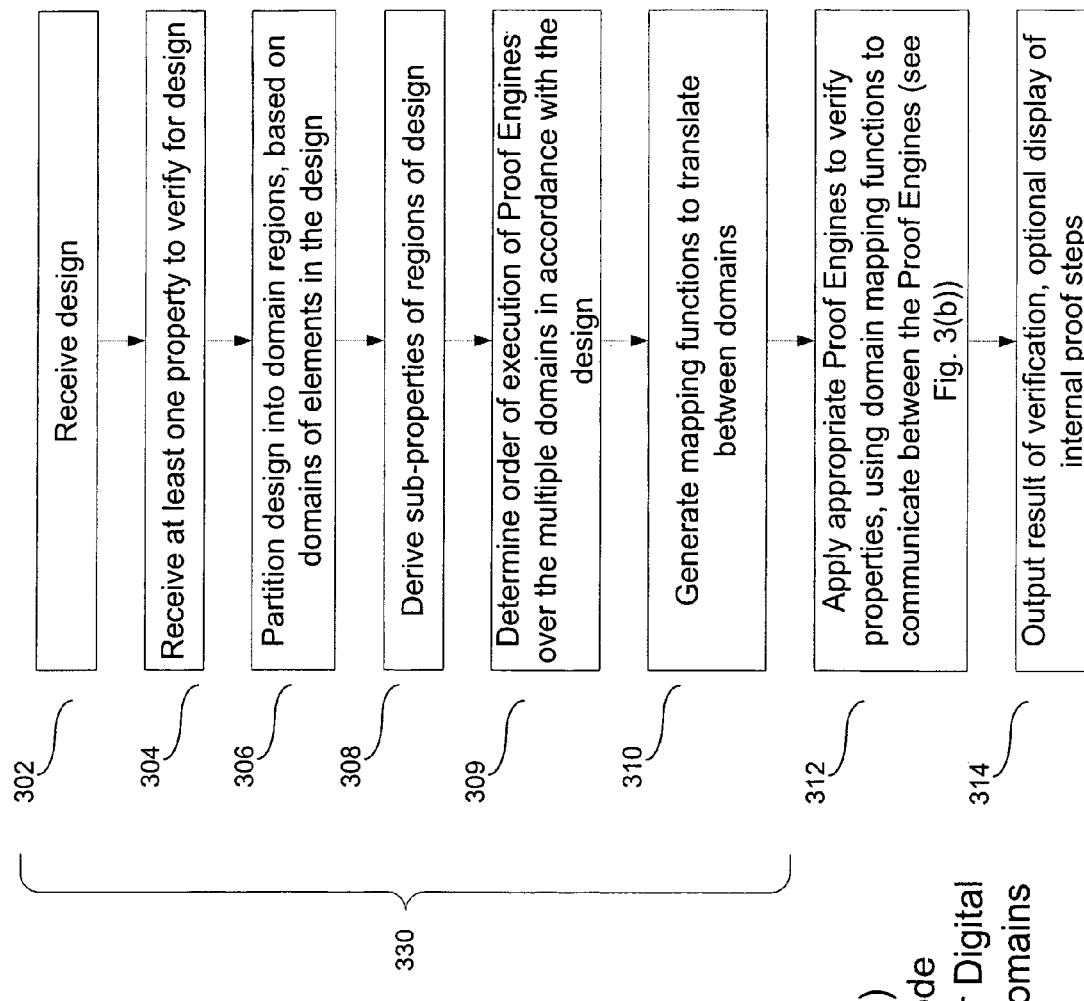
FIGS. 3(a) and 3(b) are flow charts showing an example method performed by a mixed mode verifier.
Figure 3B:
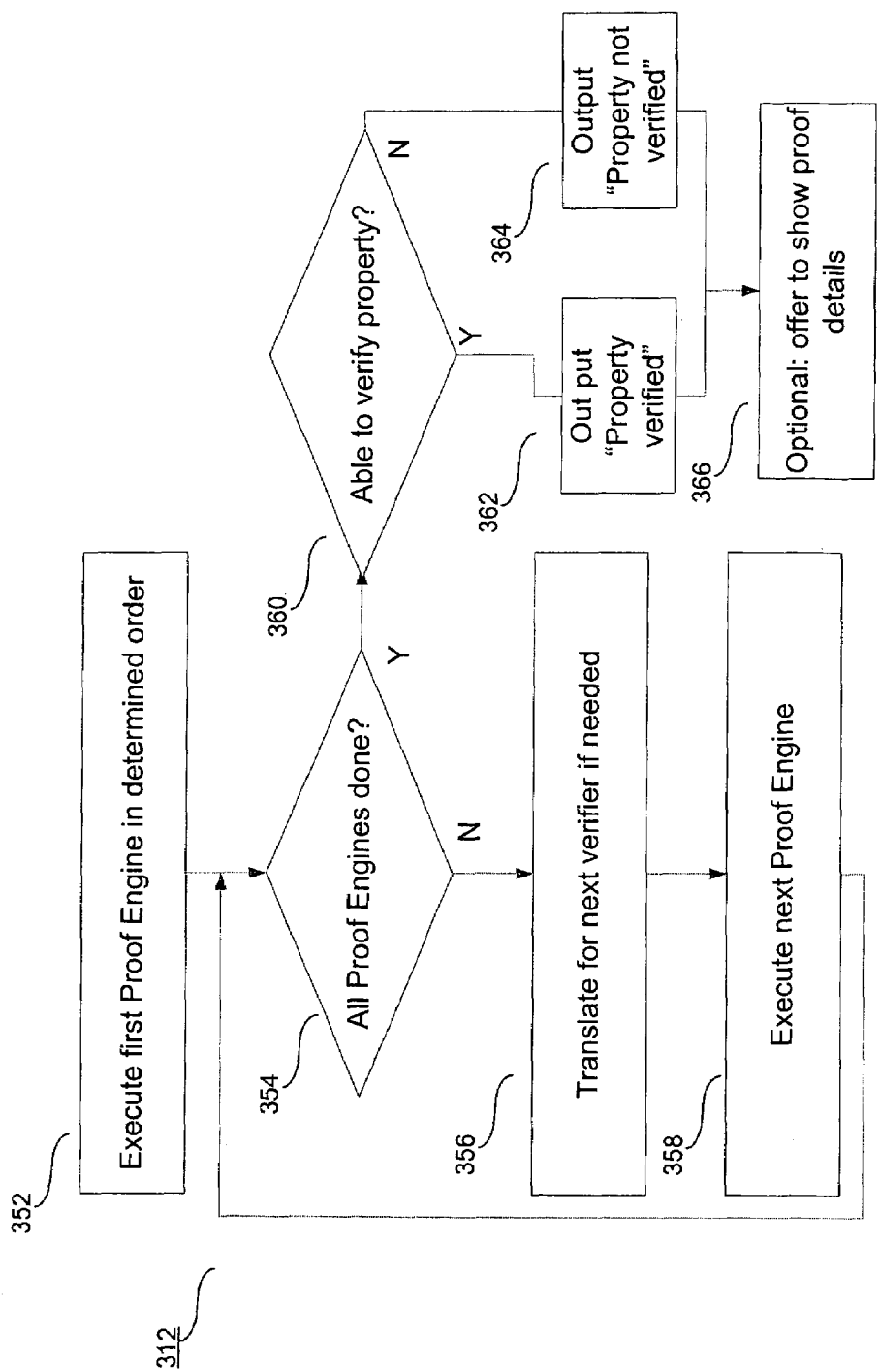

FIG. 3(a) and 3(b) are flow charts showing an example method performed by mixed mode verifier 122. In the example, the steps of FIGS. 3(a) and 3(b) are performed by processor 102 or other processor executing verifier 122, and using mapping functions 124 and proof engines 123. In some embodiments, the proof engines are executed on the same system as the basic verifier framework, but this is not required. For example, in distributed, cooperative, or networked systems, these functions may be performed by one or more separate processors or systems. As discussed above, other embodiments may use hardware or firmware implementations of some or all of the elements.

In element 302, verifier 122 receives a representation of DUT 120. This representation can use any appropriate format, such as, for example, verilog or VHDL (digital domain) or SPICE, EDIF, netlists (analog domain), models in any programming language such as C. C++, Java or any model for which there is a formal semantics and proof theory.

Figure 4A:
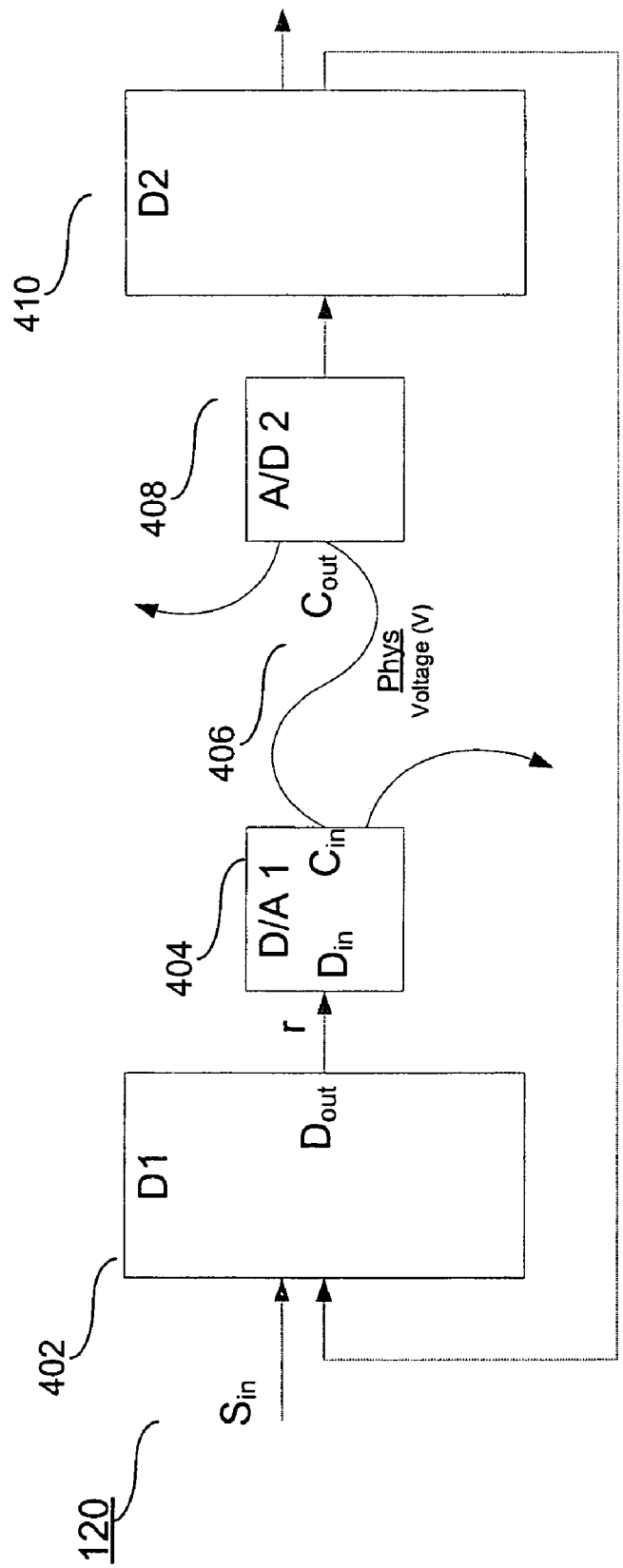
FIG. 4(a) shows an example device to be verified that has mixed domains.

FIG. 4(a) shows an example of DUT 120 having elements of differing domains, specifically an analog domain and a digital domain. The design of FIG. 4(a) is a simplified version of an analog control design, with digital counter logic and analog controlled values. Digital element D1 402 sends a control value r to analog circuitry 406 via D-to-A converter 404. The analog output of circuitry 406 is converted to a digital value via A-to-D circuit 408 and input to digital element D2 410, which is fed back to element D1.

Returning to FIG. 3(a), next, verifier 122 receives 304 at least one property to verify for DUT 120. FIG. 4(b) shows an example property 434:

$$\forall r \in R, r => Cout \in Cmin \ldots max$$

where R is the ordered set [Rmin . . . Rmax].

These properties indicate that for a range of input values output from digital element D1, the caffying current in the analog element 406 will not exceed a defined range of Cmin . . . Cmax, inclusive. As shown in FIG. 1, the initial property to be proved and its sub-properties (derived by the system 100) are stored in a memory 104.

This example property 434 references both the digital and analog domains. It should be noted, however, that it is the mixed domains in DUT 120 that may prompt the use of a mixed-mode verifier tool. Even if the properties to be formally verified do not themselves reference multiple domains, if DUT 120 included elements in multiple domains then a mixed mode verifier may be used to prove correctness of the design. Thus, even a property that does not include elements from multiple domains may require a mixed mode formal verifier.

Returning to FIG. 3(a), in an example embodiment, elements 302–310 may be performed by a framework section 206 of verifier 122 and may be collectively designated as an "analysis" module. These elements are designated by reference numeral 330. Verifier 122 partitions 306 DUT 120 into regions in accordance with the domains of the DUT. For example, for DUT 120 of FIG. 4(a), verifier 122 partitions DUT 120 into an analog region (A/D1 and A/D2) and digital regions (D1 and D2). Such partitioning can often be performed simply by looking at the type of input files used to specify the DUT. For example, if a DUT includes a Verilog or VHDL file, then that portion of the design is a digital portion. Moreover, a design can be partitioned by hand or automatically. Some designs come automatically partitioned because of the tool used to create them or the tools that would have been used to simulate them.

In element 308, verifier 122 derives sub-properties for the sub-partitions of different domains using known methods. For example, the sub-property can be done by a user using a GUI 202 of the verifier 122. Alternately, verifier 122 can include rules to derive sub-properties. In general, a sub-property is specific to a particular domain and thus, can be proved by a proof engine for that domain. A sub-property can have multiple parts, as in the example below which contains a logical AND function. In the example of FIGS. 4(a) and 4(b), the sub-property 444 derived for the digital domain is:

$$S_{in} => r \in R \text{ AND } R => P(D_{out})$$

This means that Sin implies that each value "r" is contained in a predefined range and that R implies a predetermined property P of Dout.

Similarly, the sub-property 454 derived for the analog domain is:

$$C_{out} => C_{in}$$

This means that the value of Cout implies a value of Cin.

In element 309, verifier 122 determines an execution order of the various proof engines that will be used to prove the sub-properties for the multiple domains. Execution order is discussed below in connections with FIGS. 5 and 6.

In element 310, verifier 122 generates mapping functions to translate between the derived sub-properties. In the example, the mapping function 464 (also called a translation function) is:

$$C_{out} = T(D_{in})$$

This means that a predetermined translation function T is applied to the value of Din to obtain Cout. The translation function can be initially input by the user, or can be part of the representation of the DUT, for example. Other example of translation functions can be predefined. For example, an example translation function to translate between a single bit digital output and an analog input voltage might be represented as a function indicating: "a digital value of '0' becomes X volts and a digital value of '1' becomes Y volts". Such translation functions are generally stored in memory 104, whether they are input by a user or predefined. Translation functions appropriate to each proof domain are provided as part of the configuration of the tool when using different engines.

In element 312, verifier 122 applies appropriate proof engines to verify each of the sub-properties derived in element 308. In general, a sub-property is specific to a particular domain and thus, can be proved by a proof engine for that domain. Additional details of element 312 are shown in FIG. 3(b). Finally, in element 314, the user is informed whether the verifier 122 was able to formally verify the property for the particular DUT. In certain embodiments, the user is given the option of viewing a detailed trail of the proof steps performed by the proof engines.

In FIG. 3(b), verifier 122 executes proof engines for the multiple domains in an order determined in element 309. To begin, a first proof engine 352 is executed to prove a first sub-property in a domain specific to that first proof engine, if all proof engines 354 determined in step 309 have been executed, control passes to element 360 as described below, if not, subsequent proof engines 356,358 are executed for respective sub-properties specific to that proof engine until all need proof engines have been executed.

In another embodiment, verifier 122 executes more than one proof engine method for each type of sub-partition in the design. For example if a first sub-partition is defined in a first domain D, an embodiment executes multiple proof engines for domain D. Verifier 122 considers that a proof has been obtained for that domain if at least one of the multiple proof engines operating on domain D completes.

In element 360, in some embodiments, if the proof engines working together were able to verify the property, the user may be notified 362. Otherwise, the user may be notified 364 that the property cannot be formally verified or that the proof did not complete, depending on the properties of the specific engine used. In either case, in an embodiment, the user may be offered the option 366 to view details of the work of the proof engines. The proof engines may push details of their work into memory or onto a stack during the proving process in order to present it at the end of the process.

In element 314 of FIG. 3(a), verifier 122 displays the output of the formal verification (same as steps 360–366 of FIG. 3(b)). In certain embodiments, the user may be given the option of also displaying the intermediate steps of the formal verification proof. This output step provides the user with a tangible and concrete indication of whether the property is verifiable for DUT 120. It is useful for the user to be able to prove that a design has been formally verified and to obtain a printout of the method used in that verification.

FIG. 5 shows an example control flow 500 for a mixed mode verifier. FIG. 5 includes an input GUI 502 and an output GUI 504 to allow the user (or other programs or entities) to communicate with verifier 122. This example shows a simple case where a DUT includes an element from each of two domains. The order of control flow is indicated by the small circles with numbers inside and is determined during step 309 of FIG. 3(a). In an embodiment, step 309 determines an order by analyzing the inputs and outputs of the modes of different elements and uses known methods, such as data flow ordering, to determine which proof element has interdependencies on which other proof elements and therefore must execute after those elements. For example if one proof engine operating in a first domain must prove a sub-property for its output and translate that output before a second proof engine operating in a second domain may execute, the order of execution of the proof engines will reflect this dependency, with the first proof engine being performed before the second proof engine.

In the example of FIG. 5, control begins with input of the DUT at time #1, proceeds to the framework 506 #2. Under control of the framework 506 of verifier 122, control proceeds #3 through a first proof engine 510, which proves a first sub-partition in a first domain, and returns to the framework 506 for any translation 505 #4 needed as input for the next proof engine. Next, a second proof engine 520 proves #5 a second sub-property for a second domain and returns to the framework #6 for output of the results of the proof.

FIG. 6 shows a control flow 600 for the more complicated device of FIG. 4(a). FIG. 6 includes an input GUI 602 and an output GUI 604 to allow the user (or other programs or entities) to communicate with verifier 122. This example shows a simple case where a DUT contains elements from two domains (e.g., digital and analog) and contains one analog element, which is preceded by a first digital element and followed by a second digital element. The order of control flow is indicated by the small circles with numbers inside and is determined during step 309 of FIG. 3(a). For example, control begins with input of the DUT at time #1, proceeds to the framework 606 #2. Under control of the framework 606 of verifier 122, control proceeds #3 through a first proof engine 610, which proves a first sub-partition in a first domain (e.g., digital), and returns to the framework 606 for any translation 605 #4 needed as input for the next proof engine (e.g., digital to analog translation). Next, a second proof engine 620 proves #5 a second sub-property for a second domain and returns to the framework 606 for any translation 607 #6 needed as input for the next proof engine (e.g., analog to digital translation). Next, the first proof engine 620 proves #7 a third sub-property for the first domain and returns to the framework #6 for output #8.

Figure 7:
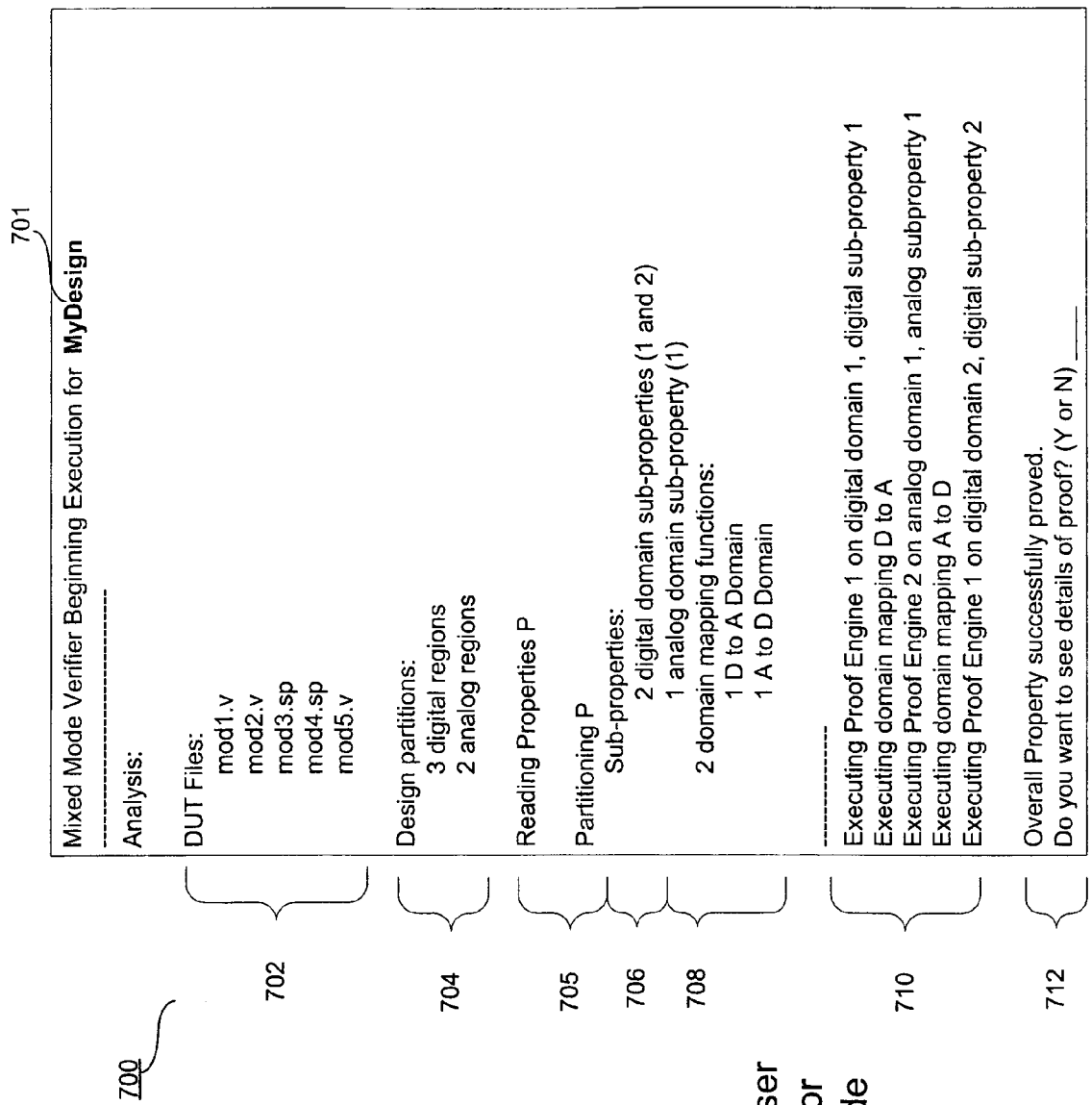
FIG. 7 shows an example user interface for a mixed mode verifier.

FIG. 7 shows an example user interface 700 for a mixed mode verifier. The Figure shows an example output from a verifier 122 having a command line interface and a simple print out, which can be directed to an output device 108 such as a file, a display, screen, another program, etc.

In an embodiment, the Mixed Mode Verifier program 122 is preferably initiated by a command line command such as, for:

>Verifier<overall design name><list of DUT files><Property to verify>

Alternately, the program can use a graphical user interface that allows the user to browse available files and indicate the various DUT files that are to be input to the verifier 122 and to further graphically indicate the properties to be verified. Alternately, the DUT files themselves can contain the properties to be verified.

In the example of FIG. 7, the overall DUT is named MyDesign 701 by the user. The user has specified five DUT files 702. As shown in area 704, three of these DUT files are digital files (e.g., verilog files) and two are analog files (e.g., SPICE files). Accordingly, verifier 122 partitions the design into three digital domain regions and two analog domain regions, corresponding to the three digital files and the two analog files. In other embodiments, a number of regions resulting from the partitioning may or may not be the same as the number of DUT files. In the example, verifier 122 reads a property or properties P 705 that are to be verified for DUT 120. As indicated above, these properties may be provided by the user or may be included as a part of the DUT files or provided in any other appropriate way.

As described in connection with FIG. 3(a), the input property is received and the system uses it to derive sub-properties that are specific to the various domains. In the example depicted in FIG. 7, the property P is used to derive two digital domain sub-properties and one analog domain sub-property, as shown by the brackets 706. Although the initially received property has elements in both the digital and analog domains, each of the sub-properties only reflects one domain and, therefore, can be input to a proof engine for that domain. In addition, verifier 122 generates two mapping/translation functions: one D-to-A function and one A-to-D function, as shown by the brackets 708.

Once the analysis is complete, as described above in FIG. 3(a), verifier 122 applies the appropriate proof engines 710 in a determined order to verify the respective sub-properties and, thus, to verify the input property P. In certain embodiments, one or more of the proof engines can operate in parallel. In the example of FIG. 7, Proof engine 1 is executed on a digital domain 1 to verify digital sub-property 1. Then a domain mapping from D to A is performed. Next, Proof engine 2 is executed on an analog domain 1 to verify analog sub-property 1. Then a domain mapping from A to D is performed. Next, Proof engine 1 is executed again on a digital domain 2 to verify digital sub-property 2. At the end, if the proof engines Proof engine1, Proof engine2, and Proof engine 3 are all able to execute to completion, the message "Output Successfully Proved" is output 712. The user is given the opportunity to see details of the proof, which are maintained by the proof engines during the verification/proof process.

FIG. 8(a) shows an example block diagram 800 of a second embodiment of a mixed mode verifier, where the verifier includes proof engines across more than two domains. In the figure, the system contains proof engines for three domains 212, 262, 222. Thus, the system includes three mapping functions for the respective domains 208, 258, and 218. The system also includes three proof engines for the respective domains 210, 260, 220. It will be understood that other embodiments operate for other types and numbers of domains. For example, an analog domain could include sub-domains of frequency and time. Similarly, a digital domain could include sub-domains of behavioral or structural domains. Other preferred embodiments include formal verification of parameters in the domains of manufacturing, power, and testability. In preferred embodiments, we may define a domain as any specific simulation and proof method that can be applied to a subpart of a design. For example, after running a proof engine on a digital subpart, we may map that result into a proof engine whose purpose is to verify a maximum transition rate of the design.

FIG. 8(b) shows an example block diagram 850 of a third embodiment of a mixed mode verifier, where the verifier includes multiple proof engines per domain. For example, in the Figure, multiple proof engines 290 are used for a first domain and multiple proof engines 292 are used for a second domain. It might also be the case that one domain would use multiple proof engines but a single proof engine would be used for a second domain. In this embodiment, multiple proof engines for a particular domain may both be used to attack the proof of a particular sub-property in that domain. In this situation, it is possible that multiple proof engines will execute to completion, providing more than one way to prove the sub-property. It may also occur that only one of multiple proof engines will complete for a given sub-property and a given element of a design in a domain. It is also possible that none of the multiple proof engines will complete. This does not mean that the design is not verifiable, only that it is not verifiable with the particular proof engine used. In an embodiment, the verifier 122 may be able to suggest other proof engines that the user may wish to incorporate based on a knowledge base or decision maker within verifier 122.

Although this description includes several embodiments, various modifications can be made within the scope of the invention. Accordingly, this disclosure is intended to be illustrative, not limiting, of the scope of the invention, which is set forth in the following claims.

What is claimed is:

1. A method of verifying a design, the method performed by a data processing system, comprising:
   receiving the design, the design having at least a first element in a first domain and a second element in a second domain;
   receiving at least one property to verify for the design;
   deriving a first sub-property for the first element of the design in the first domain in accordance with the received property and the received design;
   deriving a second sub-property for the second element of the design in the second domain in accordance with the received property and the received design;
   applying, to the first sub-property, a first proof engine adapted to prove first properties in the first domain;
   applying, to the second sub-property, a second proof engine adapted to prove second properties in the second domain; and
   combining the first and second properties to determine whether the design has been verified.

2. The method of claim 1, wherein the design includes an analog domain element.

3. The method of claim 1, wherein the design includes a digital domain element.

4. The method of claim 1, wherein the received at least one property to verify includes elements in both the first and second domains.

5. The method of claim 1, wherein deriving a first sub-property for the first element of the design includes deriving an additional sub-property for the first element of the design.

6. The method of claim 1, wherein applying, to the first sub-property, the first proof engine adapted to prove properties in the first domain further includes applying, to the first sub-property, multiple proof engines adapted to prove properties in the first domain.

7. The method of claim 1, wherein the design includes elements having properties in a third domain and where the method further includes applying, to the a sub-property in the third domain, a proof engine adapted to prove properties in the third domain.

8. A computer system configured to verify a design, comprising:
   a memory configured to store at least the following:
      a design, the design having at least a first element in an analog domain and a second element in a digital domain,
      at least one property to verify for the design; and
   a processor configured to perform at least the following:
      deriving a first sub-property for the first element of the design in the analog domain in accordance with the received property and the received design;
      deriving a second sub-property for the second element of the design in the digital domain in accordance with the received property and the received design;
      applying, to the first sub-property a first proof engine adapted to prove properties in the analog domain;
      applying, to the second sub-property, a second proof engine adapted to prove properties in the digital domain; and
      combining the first and second properties to determine whether the design has been verified.

9. The computer system of claim 8, wherein the analog domain element is represented as a SPICE model.

10. The computer system of claim 8, wherein the digital domain element is represented using a Verilog format.

11. The computer system of claim 8, wherein the digital domain element is represented using the VHDL format.

12. An apparatus to verify a design, comprising:
   means for receiving the design, the design having at least a first element in a first domain and a second element in a second domain;
   means for receiving at least one property to verify for the design;
   means for deriving a first sub-property for the first element of the design in the first domain in accordance with the received property and the received design;
   means for deriving a second sub-property for the second element of the design in the second domain in accordance with the received property and the received design;
   means for applying, to the first sub-property a first proof engine adapted to prove first properties in the first domain;
   means for applying, to the second sub-property, a second proof engine adapted to prove second properties in the second domain; and
   means for combining the first and second properties to determine whether the design has been verified.

13. The apparatus of claim 12, wherein the design includes an analog domain element.

14. The apparatus of claim 12, wherein the design includes a digital domain element.

15. The apparatus of claim 12, wherein the means for applying, to the first sub-property, a first proof engine adapted to prove properties in the first domain further includes means for applying, to the first sub-property, multiple proof engines adapted to prove properties in the first domain.

16. One or more computer-readable media containing instructions that are executable to perform actions comprising:
   receiving a design, the design having at least a first element in a first domain and a second element in a second domain;
   receiving at least one property to verify for the design;
   deriving a first sub-property for the first element of the design in the first domain in accordance with the received property and the received design;
   deriving a second sub-property for the second element of the design in the second domain in accordance with the received property and the received design;
   applying, to the first sub-property a first proof engine adapted to prove first properties in the first domain;
   applying, to the second sub-property, a second proof engine adapted to prove second properties in the second domain; and
   combining the first and second properties to determine whether the design has been verified.

17. The one or more computer readable media of claim 16, wherein the design includes an analog domain element.

18. The one or more computer readable media of claim 16, wherein the design includes a digital domain element.

19. The one or more computer readable media of claim 16, wherein the received at least one property to verify includes elements in both the first and second domains.

20. The one or more computer readable media of claim 16, wherein deriving a first sub-property for a first element of the design includes deriving an additional sub-property for the first element of the design.

* * * * *